(12) United States Patent
Mayer et al.

(10) Patent No.: US 7,743,295 B2
(45) Date of Patent: Jun. 22, 2010

(54) SYSTEM AND METHOD FOR TESTING AN INTEGRATED CIRCUIT

(75) Inventors: Albrecht Mayer, Deisenhofen (DE); Klaus Scheibert, Grasbrunn (DE); Harry Siebert, Puchheim (DE)

(73) Assignee: Infineon Technologies AG, Neubiberg (DE)

( * ) Notice: Subject to any disclaimer, the term of this patent is extended or adjusted under 35 U.S.C. 154(b) by 577 days.

(21) Appl. No.: 11/686,015

(22) Filed: Mar. 14, 2007

(65) Prior Publication Data

US 2007/0220336 A1 Sep. 20, 2007

(30) Foreign Application Priority Data

Mar. 14, 2006 (DE) ............. 10 2006 011 705

(51) Int. Cl.
*G01R 31/28* (2006.01)
*G06F 11/00* (2006.01)

(52) U.S. Cl. ..................... 714/724; 714/742
(58) Field of Classification Search .......... 714/34, 714/40, 57, 724, 742; 711/105, 106
See application file for complete search history.

(56) References Cited

U.S. PATENT DOCUMENTS

| | | | | |
|---|---|---|---|---|
| 4,616,331 A | * | 10/1986 | Kinoshita et al. | 712/32 |
| 4,734,849 A | * | 3/1988 | Kinoshita et al. | 712/207 |
| 5,502,732 A | * | 3/1996 | Arroyo et al. | 714/746 |
| 5,561,671 A | * | 10/1996 | Akiyama | 714/799 |
| 5,614,944 A | * | 3/1997 | Taura et al. | 348/183 |
| 6,009,028 A | * | 12/1999 | Akiyama | 365/201 |
| 6,223,309 B1 | * | 4/2001 | Dixon et al. | 714/703 |
| 2005/0242921 A1 | * | 11/2005 | Zimmerman et al. | 340/5.2 |
| 2006/0073283 A1 | | 4/2006 | Brown et al. | |

FOREIGN PATENT DOCUMENTS

| | | |
|---|---|---|
| JP | 63072875 | 4/1988 |
| JP | 10001772 | 1/1998 |

OTHER PUBLICATIONS

"Trends in manufacturing test methods and their implications" by Kundu et al. This paper appears in: Test Conference, 2004. Proceedings. ITC 2004. International Publication Date: Oct. 26-28, 2004 on pp. 679-687 ISBN: 0-7803-8580-2 INSPEC Accession No. 8263170.*
Motorola Inc.: "Power QUICC—MPC860 User's Manual", 1998.

* cited by examiner

*Primary Examiner*—Cynthia Britt
(74) *Attorney, Agent, or Firm*—Dicke, Billig & Czaja, PLLC

(57) ABSTRACT

A system and method for testing an integrated circuit is disclosed. One embodiment includes at least one central processing unit, at least one volatile memory area, and an interface, wherein the volatile memory area is connected to the interface to be written thereto by the interface. The system includes a test device connected with the integrated circuit which is configured to stop the program execution, write data in the volatile memory by using the interface, and start the program execution.

22 Claims, 1 Drawing Sheet

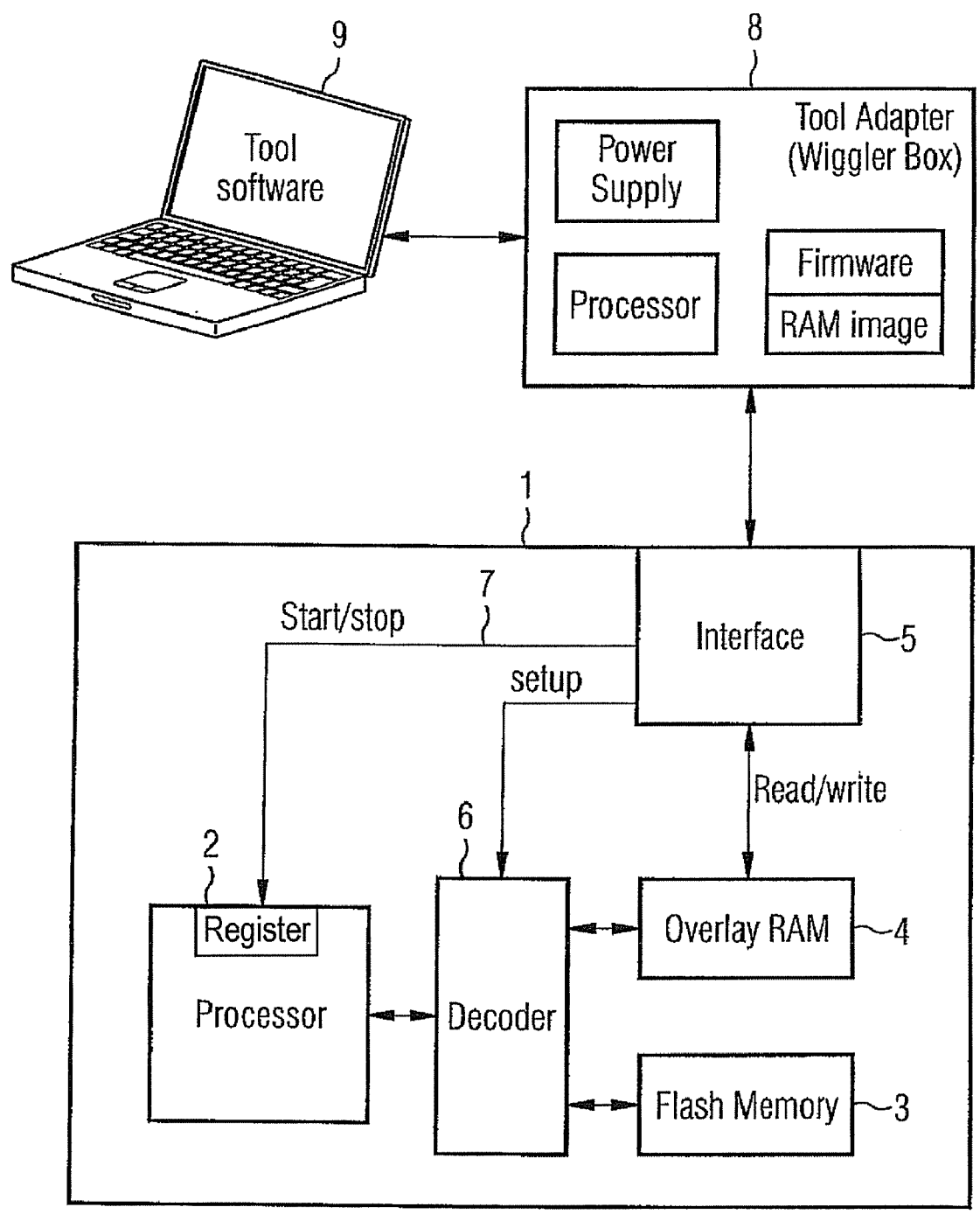

SYSTEM AND METHOD FOR TESTING AN INTEGRATED CIRCUIT

CROSS-REFERENCE TO RELATED APPLICATIONS

This Utility Patent Application claims priority to German Patent Application No. DE 10 2006 011 705.0 filed on Mar. 14, 2006, which is incorporated herein by reference.

BACKGROUND

The invention relates to a system and a method for testing an integrated circuit.

Modern microcontrollers, in particular "Systems on a Chip" (SoC), include at least one memory area and at least one Central Processing Unit (CPU) with a processor on a chip. In the memory area, a complex software program executed by the processor and further data may be stored, which the processor accesses during processing.

During the development of the software program and of the chip itself, and of the function blocks surrounding the chip, the chip and the software program have to be tested. To this end, it is necessary that the software program runs through the situations to be tested so as to cause and observe the reaction of the software program or of the chip, respectively.

The situations to be tested may, however, not be caused with reasonable effort in that the program stored in the chip and the parameter data are changed frequently and the normal progress of the software program is executed up to the relevant place in the instruction sequence of the program.

Furthermore, system parameters, for instance, constants for actuators that are controlled by the SoC, have to be optimized. This calibrating requires the repeated running through of an instruction sequence with parameters, wherein these are optimized between the cycles.

Thus, there is the need to repeatedly bring the software program executed on the SoC in a particular situation, so that a particular program section and thus a desired instruction sequence is run through. In so doing, it must be possible to vary parameters that are processed by the software program and influence the program flow, so that a particular situation can be run through with different parameter values.

From prior art, possibilities for performing such a calibration are known.

DE 102 37 173 discloses a method for collecting temporary measurements in a programmed control device, wherein the control device includes a microcontroller—and thus a processor, and a memory. The memory includes, on the one hand, a volatile memory area whose content is lost without power supply, and which is, for instance, a RAM in which predominantly the variable parameters are stored. On the other hand, the memory includes a non-volatile memory area in which the program to be executed is stored. By an address register, a section of the RAM memory area can be indicated as Calibration RAM (CALRAM), so that the processor accesses the CALRAM instead of the memory areas that are specifically stored in the program flow. Via an emulator sensing head, the memory areas defined as CALRAM can be accessed in reading and writing, so that the desired data and instruction sequences can be written in these memory areas and are subsequently processed by the processor. Via the emulator sensing head, the content of the CALRAM and thus the content of the parameters can be read.

This solution, however, has the disadvantage that an emulator sensing head has to be used.

WO 03/102961 describes another method by which the instructions and data to be processed by the processor of a SoC can be manipulated via an interface from outside. The SoC or the method, respectively, serve the calibration of an SoC with a volatile memory area, for instance, a RAM, and a non-volatile memory area, for instance, a flash EEPROM, and a processor. The software program to be executed and the data are stored in the flash EEPROM in the normal state of the SoC. In the normal state, the processor accesses the flash EEPROM to read and process the software program and the data. For calibration of the data, the SoC can be accessed via an interface from outside such that the SoC passes into a calibration mode. In this mode, the data to be calibrated are copied into the volatile memory area. The volatile memory area is assigned the address of that non-volatile memory area in which the data to be calibrated have been stored so far, so that the processor, when accessing the data to be calibrated, will henceforth access the volatile instead of the non-volatile memory area. Via the interface, a user may input instructions and data for processing by the processor and thus calibrate the parameters. Subsequently, the modified data are written back from the volatile memory area in the non-volatile memory area, so that they are permanently stored.

This method and the pertinent SoC, respectively, has the disadvantage that an instruction sequence for the calibration mode and for writing the data from the non-volatile memory in the volatile memory and back has to be provided in the software program. To be able to store this instruction sequence in the non-volatile memory, it has to be designed correspondingly larger.

In a further known solution, the microcontroller includes, for storing the program to be executed in normal operation, exclusively a volatile memory that is adapted to be written with modified data for testing and calibrating the microcontroller. Here it is of disadvantage that this memory permanently has to be supplied with voltage. Since usually only the memory, but not the entire microcontroller has to be supplied with voltage, considerable effort is practiced to limit the memory as the area of permanent voltage supply on the microcontroller.

For these and other reasons, there is a need for the present invention.

SUMMARY

One embodiment provides a system for testing an integrated circuit including least one central processing unit, at least one volatile memory area, an interface, wherein the memory area is configured to be written using the interface. A test device is coupled with the integrated circuit, wherein the test device is configured to stop program execution, write data in the volatile memory area via the interface, and start program execution.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic representation of an inventive integrated circuit 1 in which functional groups are schematically illustrated as blocks.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments of the invention provide a method and a system for testing an integrated circuit, which enable to write an instruction sequence to be processed and/or data to be processed as quickly as possible and with little effort into a memory area of the circuit.

It achieves this and further objects by the subject matters of claims 1 and 12.

In accordance with one embodiment of the invention there is suggested a system with an integrated circuit with at least one central processing unit, at least one volatile memory area, and an interface, wherein the memory area is adapted to be written by means of the interface. The system is designed to stop the program execution, to write data in the volatile memory by means of the interface, and to start the program execution.

By stopping and starting the program execution, the integrated circuit can be placed in a state in which the central processing unit, i.e. the processor, stops an execution of the program, or does not start it at all, and thus does not or no longer access memory areas. The function of all the other function groups available on the chip is, however, maintained in this state. Using the interface that is connected with the volatile memory, the memory can now be written, so that data can be stored in the volatile memory area via the interface. The data may be both instruction sequences executed by the processor, and parameter data that can be processed with the instruction sequences. After the data have been written in the memory area, the program execution and thus the processing of the data can be started again.

This way, any data and instruction sequences can be transferred into the integrated circuit from outside, and are subsequently processed by the processor.

In correspondence with the described proceeding, in accordance with a second aspect embodiment of the invention there is suggested a method for testing an integrated circuit that includes at least one central processing unit, a volatile memory area connected therewith, and an interface connected with the memory area, and which includes at least the following method processes:

(a) stopping the program execution;
(b) writing data in the volatile memory by means of using the interface;
(c) starting the program execution.

FIG. 1 illustrates a schematic representation of an inventive integrated circuit 1 in which functional groups are schematically illustrated as blocks. The illustrated integrated circuit is a microcontroller as it is in particular used in the automotive field in control devices of internal combustion engines or the like. Such a microcontroller is, in normal operation, connected with a plurality of sensors via which the microcontroller receives signals reflecting individual parameters of the engine. Furthermore, the control device and thus the microcontroller is connected with actuators, e.g., the fuel injection system of the engine, via which the microcontroller controls the engine.

The microcontroller may include more than the functional groups illustrated in FIG. 1. In the instant case, however, only the functional groups that are necessary for the invention are illustrated. Connections to the further functional groups contained in the microcontroller and the groups themselves are thus not illustrated. Likewise, peripheral connections of the microcontroller, e.g., to the voltage supply, are not illustrated.

The integrated circuit 1 includes at least one central processing unit 2, namely a processor. It is capable of accessing a non-volatile memory 3. The non-volatile memory 3 may be an EPROM known from prior art, in particular an EEPROM or a flash EEPROM.

In the non-volatile memory 3, the instruction sequence provided to be processed by the processor 2, i.e. the executable software program, and parameter data are stored persistently. For the example of a microcontroller from the automotive field as described here, the software program may, for instance, be a control program for the internal combustion engine. The parameter data are, for instance, those data that are processed by the processor—in addition to the information supplied by the sensors—for controlling the engine so as to calculate the data to be signalized to the actuators, for instance.

In addition to the non-volatile memory 3, the integrated circuit 1 includes a volatile memory 4 and an interface 5. The volatile memory 4 is connected with the interface 5, so that the volatile memory 4 is adapted to be read out and to be written by the interface 5.

The volatile memory 4 may be a RAM known per se from prior art.

The interface 5 may be any interface known from prior art, via which data can be transmitted from and to the microcontroller. One embodiment is a serial interface that requires only few contacts and thus requires only few pins or pads at the chip, so that the number of pins or pads can be kept as small as possible. Furthermore, the interface 5 should be as fast as possible, i.e. enable a high data transfer rate.

One embodiment of such an interface 5 is a "Universal Serial Bus" (USB) interface that enables a high data transfer rate.

The interface 5 may be a test interface pursuant to JTAG Standard IEEE 1149 which is provided for the transferring of test data in integrated circuits.

In another embodiment, the interface 5 may also be configured to serve as intermediate station for a plurality of JTAG test interfaces positioned on the microcontroller. In this embodiment, the interface 5 accepts data from outside in any format and pursuant to any transfer protocol and transmits the information substantially to the plurality of JTAG test interfaces. In the reverse direction, the plurality of JTAG test interfaces signalize information to the interface 5 that transmits the information to the outside after an appropriate format adaptation.

The microcontroller 1 further includes an address decoder 6 for assigning physical memory addresses to logic ones. It is connected with the interface 5, so that the content of the address decoder 6 can be read out and written by the interface 5. The address decoder 6 can thus be configured from outside by the interface 5.

Via the address decoder 6, it may be determined at which physical memory address data or instruction sequences are, for instance, read out or written by the processor 2.

In a first embodiment, the address decoder may be substantially realized in software. To this end, the address decoder may substantially be designed as a table in which the physical memory addresses can be assigned to the logic ones and in which the physical memory addresses can be modified by using the interface 5. This table is queried or read out, respectively, by the processor 2 prior to the beginning of the actual data processing. In the subsequent data processing, the processor 2 correspondingly accesses the read physical memory addresses. If this table is modified by using the interface 5 for a test or a calibration, it can thus be controlled that the processor 2 henceforth accesses the volatile memory at least partially.

In an alternative, second embodiment, the address decoder may be realized in hardware as a Memory Management Unit (MMU), wherein the configuration of the MMU can be read and written by using the interface 5. To this end, the MMU is connected with the interface 5. The MMU receives requests of the processor for data and supplies them back. In normal operation, i.e. if no test and no calibration take place, the MMU is configured such that the non-volatile memory 3 is accessed. If the configuration of the MMU is modified for a test or a calibration, by which the access to data is at least partially directed to the volatile memory 4, this is transparent for the processor 2.

Thus, it can be predetermined that the processor 2 does not access, for instance, the non-volatile memory 3, i.e. the flash EEPROM 3, for reading and writing particular data, but expects these data in the volatile memory 4, i.e. the RAM. By using this method that is known as "overlay" it is thus possible to configure that the processor accesses the volatile memory 4 that can be read out and written via the interface 5.

The integrated circuit 1, in the example described here the microcontroller, further includes a mechanism for stopping and starting the program execution, so that the regular execution of the program can be stopped and started—again—via this means.

In a first embodiment, the program execution may be stopped in that the clock signal required for processing is interrupted, so that the processor 2 does not execute any more instruction.

The mechanism may also be designed such that the clock signal is maintained, the processor 2 examines a register bit and, if this register bit has a particular value, henceforth runs in a waiting loop. In the waiting loop, the processor 2 cyclically examines the register bit and starts the program execution or continues same, respectively, if the register bit has a corresponding value. This can, for instance, be a bit of a register which is queried by the processor—at least during the starting process. If, for instance, this register bit has a high level—a logic 1—, the processor stops the further program execution until the content of this register bit changes its state.

The register bit may, for instance, be connected with the interface 5 via a connection 7 and thus be adapted to be set and reset by the interface 5 such that the program execution can be stopped and started via the interface 5. The regular execution of the program can thus at the earliest be stopped at a point in time at which the interface 5 is ready for operation and a value can be written in the register bit.

This register bit can be guided to a connecting contact of the microcontroller 1, so that the register bit can directly or indirectly be written or read via a pin or a pad and can thus be set independently of the interface 5.

In a further embodiment, the mechanism may be designed such that the processor 2 directly examines a voltage value of a pin or pad of the chip at least during starting and stops or starts the regular program execution as a function of the value.

The FIGURE further illustrates a "tool adapter" 8. Such adapters are known from prior art, so that the characteristics of the adapter 8 are only described here to the extent that they are of significance for the invention. The adapter 8 is, on the one hand, connected with the interface 5 of the microcontroller 1 and, on the other hand, with a host computer 9. The adapter 8 enables the data exchange between the host computer 9 and the microcontroller 1 by converting the data between the two interfaces thereof to the respective format of the underlying data connection. The host computer 9 may be a PC known per se, on which an application program by which the microcontroller can be tested is executed. With such an application program, the parameter values to be calibrated can, for instance, be generated and transferred to the microcontroller, and be read by the microcontroller in reverse direction.

This way, data can be generated on the host computer 9, be transferred to the interface 5 via the adapter 8, and be written in the volatile memory 4, so that these data—with a corresponding configuration of the address decoder 6—are processed by the processor. Vice versa, the host computer 9 can read data from the volatile memory 4 via the adapter 8 and the interface 5.

In normal operation, i.e. when the microcontroller is not to be tested or the parameter data are not to be optimized, the means for stopping and starting of the program execution remains unused, so that, during switching on, the processor starts the regular execution of the software program and the processing of the parameter data without delay. The address decoder 6 is then configured such that the processor reads the software program to be executed and the parameter data from the non-volatile memory 3. The RAM, i.e. the volatile memory 4, can be used arbitrarily, for instance, to temporarily store data. Usually, however, at least part of the volatile memory 4 is reserved to be used as calibration RAM that is not used in the normal operation of the microcontroller 1.

For an optimal use of a microcontroller in a specific application, the values of parameters usually have to be adapted and optimized for the specific application. With such a calibration, the software program is therefore run through with different parameter values at the location at which the parameters are used.

To be able to efficiently perform such a calibration of parameter values, it is desirable to have only that instruction sequence of the software program processed with the parameter values which is respectively relevant for the parameters.

With such a method for the calibration of parameter values or—also more general—for testing the microcontroller 1 with particular data, the program execution is stopped as soon as the bus systems and the volatile memory 4 have obtained sufficient voltage during switching on and are ready for use, but the processing of the data stored in the non-volatile memory 3 has not started yet. The microcontroller 1 to this end includes the above-described means for stopping and starting the program execution.

In the next method process, the data to be processed are written in the volatile memory 4 of the microcontroller 1. These data include the parameter values modified for this processing cycle. If the volatile memory 4 is sufficiently large, the data may also include the instruction sequence with which the parameter values are to be processed. To this end, the data to be written in the volatile memory 4 are transferred to the microcontroller 1 by using the interface 5.

Depending on the configuration of the interface 5, the microcontroller may, for the transmission of data, be connected with an adapter 8 in which the data to be transmitted can be stored. For instance, with a configuration of the interface 5 pursuant to the USB standard, the adapter 8 can be dispensed with; its function will then be assumed by a host computer 9.

The address decoder 6 is configured such that the physical address in the volatile memory 4, i.e. in the RAM that has just been written with the parameter values, is assigned to the logic address of the parameter data. For processing the parameter values, the processor 2 will then access the parameter values transferred to the microcontroller in the previous method process.

If not only parameter values, but also the instruction sequence to be executed with the parameter values was stored in the volatile memory 4, the address decoder 6 has to be configured correspondingly, so that the processor accesses the volatile memory 4 also for reading the instruction sequence.

For changing the configuration of the address decoder 6, corresponding data that define the assignment of the physical memory addresses to the logic ones are, via the interface 5, transferred to the address decoder 6 and written in the table thereof.

The configuration of the address decoder 6 may take place prior to or after the storing of the data in the volatile memory 4. The order of method processes by which the volatile memory 4 is written and the address decoder 6 is correspondingly configured is therefore arbitrary.

As soon as the data have been stored in the volatile memory 4 and the address decoder 6 has been configured correspondingly, the execution of the program is started. This happens for the above-mentioned variants of the means, for instance, in that a corresponding register bit is modified via the interface 5, or a voltage level at a pin or pad of the chip is changed, or the clock signal again signalizes a clock.

If the address decoder 6 is realized in software, the processor 2 reads the physical addresses from the address decoder 6 during the starting procedure so as to henceforth access these for reading the program to be executed and the parameter values. If, however, the address decoder 6 is designed as MMU, an access to the volatile memory 4 is transparent for the processor 2.

The processing of the parameter values can subsequently be stopped again, so that the processed parameter values or other parameter values that are, for instance, generated during processing can be read out from the volatile memory 4 via the interface 5 and be transferred to a host computer 9 via the interface 5.

This method may now be repeated to iteratively determine optimal parameter values and thus calibrate the parameter values or the microprocessor, respectively.

Furthermore, the method is particularly suited to have data processed as quickly as possible by the microcontroller 1 after it has been switched on. This is, for instance, of advantage if the processing of particular data is to be tested at low temperature of the microcontroller.

In such a test, the microcontroller to be tested is initially cooled to a temperature below the test temperature. Since the microcontroller and in particular processors are heating very quickly in operation in a per se known manner, there is the need of writing the data in the volatile memory 4 as quickly as possible after switching on and of adapting the configuration of the address decoder 6 likewise as quickly as possible, so that as little time as possible lapses between the switch-on time and the beginning of the data processing.

To achieve this, during the switch-on procedure as mentioned above the point in time is determined at which the bus systems and the interface 5 are ready for use. At this point in time the program execution is stopped, and the data can be transferred to the microcontroller and be processed in accordance with the above-described method. The method is thus in particular also suited to transfer parameter data as quickly as possible to the volatile memory 4 of a microcontroller and have them processed there.

In the case of the suggested microcontroller, a non-volatile memory is now provided for storing the program to be executed in normal operation. A subdivision of the chip in an area that has to be supplied with voltage in operation of the microcontroller only, and a second area that has to be supplied with voltage permanently for maintaining the memory content is thus omitted. This omission of the separate voltage supply of the program memory considerably simplifies the design of the chip. Thus, for instance, a voltage supply means that is necessary for the permanent supply of a volatile memory can be omitted without substitution since the entire microcontroller can be switched currentless without the program stored on the microcontroller being lost.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system for testing an integrated circuit comprising:
    at least one central processing unit;
    at least one volatile memory area and at least one non-volatile memory area;
    an interface; and
    a test device coupled with the integrated circuit, the central processing unit accessing the non-volatile memory area in a normal operation mode, and wherein in a test operation mode the test device is configured to stop program execution, write data in the volatile memory area via the interface, and start program execution, the central processing unit accessing the volatile memory area in the test operation mode.

2. The system of claim 1, wherein the integrated circuit comprises:
    a circuit for stopping and starting the program execution including a register connected to the interface and configured to be written via the interface.

3. The system of claim 2, comprising wherein a signal line of the circuit for stopping and starting the program execution is connected to a connecting contact of the circuit.

4. The system of claim 1, wherein the non-volatile memory is an EEPROM.

5. The system of claim 1, wherein the integrated circuit comprises an address decoder for assigning physical memory addresses to logic addresses.

6. The system of claim 5, comprising wherein the address decoder is configurable via the interface.

7. The system of claim 5, comprising wherein at least a partial area of the volatile memory is configurable as an overlay RAM by the address decoder.

8. The system of claim 1, wherein the interface comprises a serial bus interface of any protocol.

9. The system of claim 1, wherein the interface comprises a test interface.

10. The system of claim 1, wherein the interface comprises a Universal Serial Bus interface.

11. The system of claim 1, comprising wherein the memory area is readable via the interface.

12. A method for testing an integrated circuit comprising:
defining the integrated circuit to include at least one central processing unit, a volatile memory area connected therewith, a non-volatile memory area, and an interface connected with the volatile memory area, the central processing unit accessing the non-volatile memory area in a normal operation mode, the method further comprising, in a test operation mode;
stopping a program execution;
writing data in the volatile memory area via the interface; and
starting the program execution, the central processing unit accessing the volatile memory area in the test operation mode.

13. The method according to claim 12, comprising stopping the program execution during the switch-on starting procedure.

14. The method of claim 12, comprising stopping a clock signal of the central processing unit for stopping the program execution.

15. The method of claim 12, comprising wherein the central processing unit, for stopping the program execution, examines the content of a register and, depending on the content, runs in a waiting loop.

16. The method of claim 12, comprising wherein, prior to the starting of the execution of the program, the physical address of the volatile memory is, in an address decoder, configured as address of the data to be processed.

17. The method of claim 12, comprising stopping the program execution as soon as the volatile memory area and the address decoder are ready to be written.

18. The method of claim 12, comprising wherein the central processing unit examines the content of a register at least during the switch-on starting procedure, and the program execution is stopped depending on the content of the register.

19. The method of claim 12, comprising writing only parameter values in the volatile memory.

20. The method of claim 12, comprising writing a terminated program with the parameter data to be processed in the volatile memory.

21. The method of claim 12, wherein, after the starting of the program execution, the program is stopped and the volatile memory is read by the interface.

22. The method of claim 12, wherein, prior to the stopping of the program execution, it is tested by means of a test device connected with the integrated circuit whether the integrated circuit is ready for operation.

* * * * *